United States Patent [19]

Saeki et al.

[11] Patent Number: 4,954,301

[45] Date of Patent: Sep. 4, 1990

[54] TRANSFER MOLDING PROCESS AND AN APPARATUS FOR THE SAME

[75] Inventors: Junichi Saeki; Aizo Kaneda, both of Yokohama; Kunihiko Nishi, Kokubunji, all of Japan

[73] Assignee: Hitachi, Ltd., Tokyo, Japan

[21] Appl. No.: 378,505

[22] Filed: Jul. 12, 1989

Related U.S. Application Data

[63] Continuation of Ser. No. 153,608, Feb. 8, 1988, abandoned.

[30] Foreign Application Priority Data

Feb. 25, 1987 [JP] Japan .................................. 62-40169

[51] Int. Cl.$^5$ ........................ B29C 45/2; B29C 45/76
[52] U.S. Cl. .................................. 264/40.1; 264/40.7; 264/328.4; 425/145; 425/166; 425/586
[58] Field of Search .............. 364/476; 264/40.1, 40.3, 264/40.5, 40.7, 328.1, 328.2, 328.4, 328.5, 328.13; 425/135, 145, 146, 149, 150, 543, 544, 586, 166

[56] References Cited

U.S. PATENT DOCUMENTS

| | | | |
|---|---|---|---|
| 3,883,047 | 5/1975 | Höfer et al. | 222/413 |
| 4,240,996 | 12/1980 | Hunkar | 264/40.1 |
| 4,282,176 | 8/1981 | Farrell | 264/40.1 |
| 4,301,100 | 11/1981 | Farrell | 264/40.5 |
| 4,386,898 | 6/1983 | Sera | 425/544 |
| 4,397,806 | 8/1983 | Hettinga | 264/328.14 |
| 4,407,649 | 10/1983 | Saito | 425/145 |
| 4,426,341 | 1/1984 | Tsuzuku et al. | 425/149 |
| 4,708,620 | 11/1987 | Brugger | 425/149 |
| 4,718,840 | 1/1988 | Inaba et al. | 425/587 |
| 4,743,190 | 5/1988 | Brunnschweiler et al. | 425/149 |

FOREIGN PATENT DOCUMENTS

| | | |
|---|---|---|
| 124244 | 11/1984 | European Pat. Off. |
| 2175713 | 12/1986 | United Kingdom ............... 425/149 |

*Primary Examiner*—Jill L. Heitbrink

[57] ABSTRACT

A transfer molding process and an apparatus for carrying out the same for sealing electronic devices, such as semiconductor devices, in a resin by driving a plunger downward in a pot to inject the resin into a mold. In injecting a resin into a mold by driving the plunger downward, the rotary motion of the output shaft of an electric motor is converted into a linear motion to drive the plunger downward, the downward displacement of the plunger from the initial position is detected, and pressure applied to the plunger is varied according to the displacement of the plunger. Thus, the transfer molding process and the apparatus for carrying out the same reduces defects, such as voids and incompletely filled parts, in the resin-sealed device, and prevents burrs and the deformation of the insert during the transfer molding operation.

17 Claims, 3 Drawing Sheets

TRANSFER MOLDING PROCESS AND AN APPARATUS FOR THE SAME

This application is a continuation of application Ser. No. 07/153,608, filed Feb. 8, 1988, now abandoned.

BACKGROUND OF THE INVENTION

The present invention relates to a transfer molding technique for sealing electronic devices, such as semiconductor devices, with a resin and, more particularly, to a transfer molding process and an apparatus for carrying out the same for molding resin-sealed devices not having detrimental voids and free from incomplete resin filling.

U.S. Pat. No. 4,426,341 discloses a transfer molding apparatus. In this known transfer molding apparatus, a plunger is lowered by a hydraulic plunger driving circuit capable of a closed loop control function to inject a resin into a mold. The plunger is lowered by a high pressure (primary pressure) until the pressure detected by a pressure sensor provided within the mold increases to a predetermined pressure, and then the pressure applied to the plunger is changed for a comparatively low pressure (secondary pressure) upon the arrival of the detected pressure at the predetermined pressure.

This known transfer molding apparatus is able to lower the plunger during the molding operation in a mode nearly the same as a predetermined mode regardless of disturbance, such as a resistance of the sleeve against the sliding movement of the plunger or increase in resistance against the flow of the resin, and is satisfactory as compared with the conventional transfer molding apparatus equipped with a hydraulic plunger driving circuit of an open loop control type in which only the secondary pressure is applied to the plunger throughout the molding cycle. Furthermore, since this known transfer molding apparatus changes the pressure applied to the plunger from the high pressure to the low pressure after the mold has been filled with the resin to some extent, the deformation of the insert and the formation of burrs are obviated.

However, this known transfer molding apparatus is of a hydraulic type employing a hydraulic plunger driving circuit, bubbles are liable to form in the working fluid and the temperature of the working fluid is liable to vary, which causes problem in the accuracy of control operation. Furthermore, the flow control valve incorporated into the hydraulic circuit has problems in the response characteristics that the flow control valve is unable to follow the rapid variation of the load, and that the change of the pressure from the primary pressure to the secondary pressure is delayed entailing the drop of the pressure of the resin below the secondary pressure. Thus, this known transfer molding apparatus is not necessarily satisfactory in effect for reducing voids in the resin-sealed devices and in reducing the possibility of incomplete resin filling. Still further, it is difficult to find a space for providing the pressure sensor in a mold of a complicated construction for mass production, the provision of the pressure sensor in a mold requires additional work for fabricating the mold. Thus, the application of this known transfer molding apparatus to a mass production system has been difficult.

The primary pressure can be changed for the secondary pressure without using the pressure sensor by using a signal provided by a limit switch disposed so as to be closed upon the arrival of the plunger at a fixed position during the downward movement. However, as well known, the limit switch is quite unsatisfactory in the accuracy of positional detection and hence such an apparatus has problem in operating stability when applied to a mass production process, and hence such a transfer molding apparatus employing a limit switch for changing the primary pressure for the secondary pressure is not satisfactory for practical application. Japanese Unexamined Utility Model Publication (Kokai) No. 59-9538 discloses a semiconductor device sealing apparatus employing a DC servomotor for driving the plunger, however, nothing relating to controlling the movement of the plunger is stated therein.

SUMMARY OF THE INVENTION

Accordingly, it is an object of the present invention to provide a transfer molding process and an apparatus for carrying out the same, capable of overcoming the disadvantages of the prior arts, capable of molding resin-sealed devices having the least voids and the least unfilled parts, and capable of operating stably in a mass production system.

To achieve the object of the invention, the present invention provides a transfer molding process and an apparatus for carrying out the same for sealing an electronic device with a resin by lowering a plunger within a pot to inject the resin into a mold, in which the rotary motion of the output shaft of an electric motor is converted into a linear motion to drive the plunger, and the displacement of the plunger is detected to regulate a load applied to the plunger according to the displacement of the plunger in injecting the resin into the mold.

Thus, the transfer molding process and the apparatus for carrying out the same are able to produce resin-sealed devices not having voids or incompletely filled parts without forming burrs and without causing the deformation of the insert.

DESCRIPTION OF THE PREFERRED EMBODIMENTS

A transfer molding apparatus, in a preferred embodiment, according to the present invention will be described hereinafter with reference to the accompanying drawings.

Figure 1:
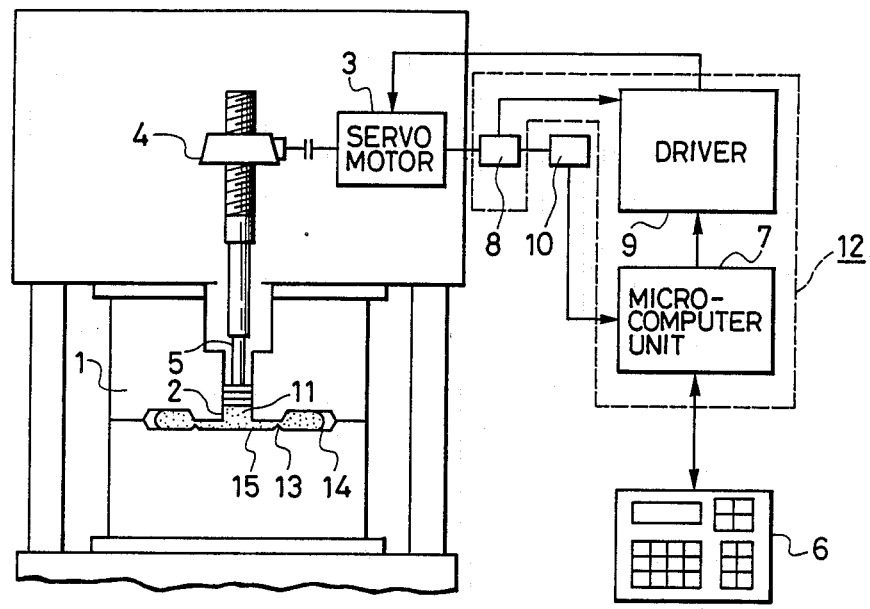
FIG. 1 is a diagrammatic illustration of a transfer molding apparatus, in a preferred embodiment, according to the present invention.
Figure 2:
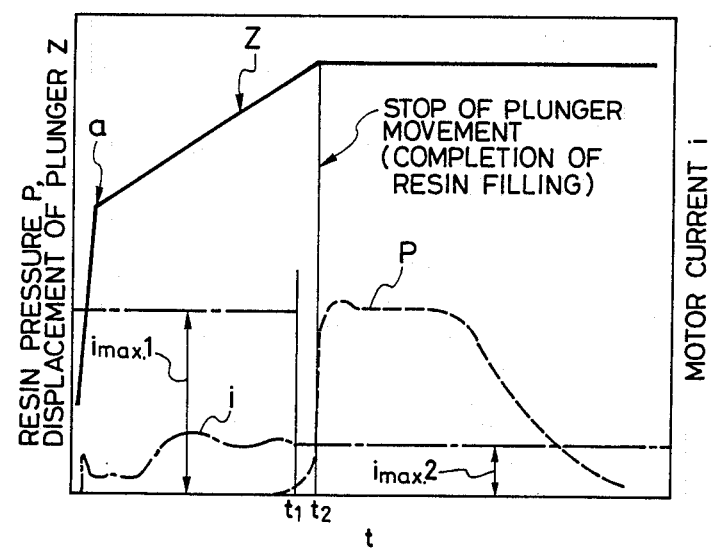
FIG. 2 is a diagram showing a molding profile of a transfer molding process employing the transfer molding apparatus of FIG. 1.

FIG. 1 is a diagrammatic illustration of a transfer molding apparatus, in a preferred embodiment, according to the present invention, and FIG. 2 is a molding profile of a transfer molding process employing the transfer molding apparatus of FIG. 1.

Referring to FIG. 1, the transfer molding apparatus is equipped with an electric plunger driving circuit having a plunger actuating switch, not shown. When the plunger actuating switch is closed, a plunger 5 is lowered within a pot 2 to inject a resin 11 into a mold 1. The electric plunger driving circuit comprises an electric servomotor 3, a pulse generator 10 for detecting the number of turns of the output shaft of the electric servomotor 3, and a control unit 12 which is set for a primary current $i_{max1}$, namely, a maximum current to be supplied to the servomotor 3, a secondary current $i_{max2}$ ($i_{max1} > i_{max2}$) and a fixed traveling distance, controls the rotating speed of the servomotor 3, supplies the primary current to the servomotor 3 when the plunger actuating switch is closed, changes the primary current to the secondary current upon the arrival of the number of turns of the output shaft of the servomotor 3 at a predetermined number, and controls the torque of the servomotor 3 after the secondary current has been supplied to the servomotor 3. The rotary motion of the output shaft of the servomotor 3 is transmitted to the plunger 5 to lower the plunger 5 after being reduced in speed and being converted into a linear motion by a ball screw jack 4, namely, a speed reducing and motion converting mechanism, interlocked with the servomotor 3.

Referring to FIG. 1, there are also shown a mold 1, a pot 2 for receiving a resin tablet, a tachogenerator 8 associated with the servomotor 3, the pulse generator 10 associated with the servomotor 3 to detect the number of rotation of the output shaft of the servomotor 3 corresponding to the displacement of the plunger 5, a motor driving circuit 9 for the closed loop control of the rotating speed of the servomotor 3 to control the rotating speed of the servomotor 3 at a predetermined rotating speed on the basis of a rotating speed signal indicating the rotating speed of the servomotor 3, applied thereto by the tachogenerator 8, a microcomputer unit 7 for controlling the action of the plunger 5 on the basis of a displacement signal provided by the pulse generator 10, a console 6 for setting a maximum motor driving current, a fixed rotating speed of the servomotor 3 and a fixed displacement of the plunger in the microcomputer unit 7, and a control unit 12 consisting of the tachogenerator 8, the motor driving circuit 9 and the microcomputer unit 7.

The manner of operation of the transfer molding apparatus thus constructed will be described hereinafter with reference to FIGS. 1 and 2 as applied to a transfer molding process using a resin having a low fluidity, such as a resin having a high filler content and a high viscosity.

A resin tablet, not shown, is put in the pot 2 of the mold 1.

Control data is set in the microcomputer unit 7 by operating the console 6. The control data includes a primary maximum current $i_{max1}$, a secondary maximum current $i_{max2}$, a first plunger displacement $d_1$ (a distance of downward travel of the plunger 5 from the initial position to a fixed position where the lower end of the plunger 5 is located slightly above the upper end of the resin tablet put in the pot 2), a second plunger displacement $d_2$ (a distance of downward travel of the plunger 5 from the initial position to a fixed position where the lower end of the plunger 5 is located at a fixed position immediately before the final lower position where resin injection is completed, namely, a position below the fixed position where the lower end of the plunger 5 is located slightly above the upper end of the resin tablet), a first rotating speed $N_1$, and a second rotating speed $N_2$ ($N_2 < N_1$).

When the plunger actuating switch, not shown, of the transfer molding apparatus is closed, the microcomputer unit 7 gives a speed control command signal to the motor driving circuit 9 to control the operating speed of the servomotor 3 at the first rotating speed $N_1$, and sets a maximum current at the primary maximum current $i_{max1}$. Then, the motor driving circuit 9 supplies a current to the servomotor 3 to make the servomotor 3 run at the first rotating speed $N_1$. The rotary motion of the output shaft of the servomotor 3 is transmitted to the ball screw jack 4, which reduces the input rotating speed, namely, the rotating speed of the output shaft of the servomotor 3, and converts the input rotary motion into a linear motion to drive the plunger 5 downward.

The tachogenerator 8 measures the rotating speed of the servomotor 3 and gives a rotating speed signal representing the operating speed of the servomotor 3 to the motor driving circuit 9 for the closed loop control of the operating speed of the servomotor 3 to maintain the operating speed of the servomotor 3 at the first rotating speed $N_1$. The microcomputer unit 7 compares a signal given thereto from the pulse generator 10 with the first plunger displacement $d_1$.

As the servomotor 3 operates at the first rotating speed $N_1$, the plunger 5 is moved downward within the pot 2 at a high speed. Upon the coincidence of the plunger displacement detected by the pulse generator 10 with the first plunger displacement $d_1$, namely, upon the arrival of the plunger 5 at a position a in FIG. 2, the microcomputer unit 7 gives a command to reduce the operating speed of the servomotor 3 from the first rotating speed $N_1$ to the second rotating speed $N_2$, so that the speed of downward movement of the plunger 5 is reduced to a low speed.

The resin tablet is heated by the heater, not shown, of the mold 1 and is reduced to molten resin 11. The molten resin 11 is injected through runners 15 and gates 13 into cavities 14 of the mold 1 by the downward movement of the plunger 5. Immediately before the completion of the resin injecting process, namely, upon the increase of the displacement of the plunger 5 to the second plunger displacement $d_2$ (point $t_1$ in FIG. 2), the microcomputer unit 7 gives a command to change the maximum current from the primary maximum current $i_{max1}$ to the secondary maximum current $i_{max2}$, while the operating speed of the servomotor 3 is maintained at the second rotating speed $N_2$. When the cavity 14 of the mold 1 is filled completely with the molten resin 11 and the plunger 5 is stopped (point $t_2$ in FIG. 2), the secondary maximum current $i_{max2}$ is supplied to the servomotor 3 to control the torque of the servomotor 3. Then, a pressure p corresponding to the secondary maximum current $i_{max2}$ is applied to the molten resin 11 for a predetermined time to complete the transfer molding process, and then the transfer molding apparatus is stopped.

The void formation rate and incomplete filling ratio of a resin-sealed device thus molded by the transfer molding process of the present invention will be explained, by way of example, with reference to FIG. 3 in comparison with those of a resin-sealed device molded by the transfer molding apparatus equipped with the conventional hydraulic plunger driving circuit.

Figure 3:
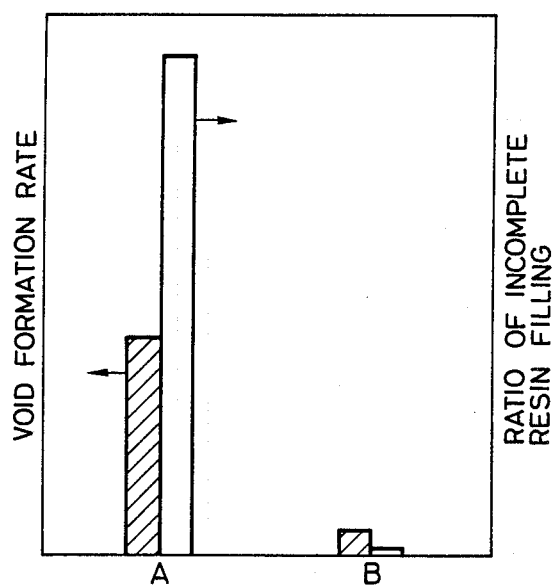
FIG. 3 is a diagram comparatively showing the respective void formation rates and incomplete resin filling ratios of resin-sealed devices molded by the transfer molding apparatus of FIG. 1 and those molded by a transfer molding apparatus equipped with a conventional hydraulic plunger driving circuit.

In FIG. 3, A represents the resin-sealed device molded by the transfer molding apparatus equipped with the conventional hydraulic plunger driving circuit, and B represents the resin sealed device molded by the transfer molding apparatus of the present invention shown in FIG. 1. As obvious from FIG. 3, the resin-sealed device B has far less defects than the resin-sealed device A.

Since the embodiment of the present invention does not need any pressure sensor in the mold, the mold can be fabricated through a simple process. Furthermore, since the embodiment of the present invention does not employ any limit switch for detecting the position of the plunger 5, the action of the plunger 5 can be controlled at a very high accuracy and at a high repeatability, which is essential to the application of the transfer molding apparatus to a mass production system.

Still further, the transfer molding apparatus of the present invention is able to inject a resin having a low fluidity in a mold having narrow runners, and hence the range of molding conditions can be expanded.

Thus, the transfer molding apparatus of the present invention is capable of molding resin-sealed devices at a very low void formation rate and at a very low incomplete filling ratio and has excellent stability as applied to a mass production system.

The transfer molding apparatus of the present invention (hereinafter referred to as "motor drive system") and the transfer molding apparatus equipped with the conventional hydraulic plunger driving circuit (hereinafter referred to as "hydraulic drive system") will be described comparatively hereinafter in respect of plunger control accuracy.

Figure 4:
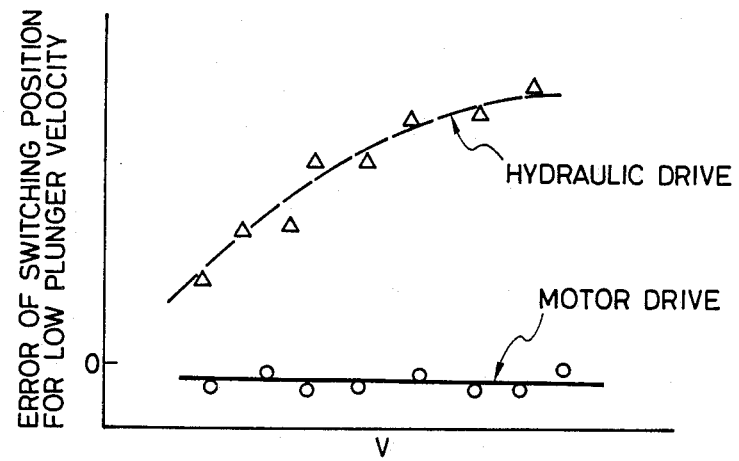
FIG. 4 is a graph comparatively showing the respective plunger control accuracies of a motor drive system employed in the present invention and the conventional hydraulic drive system in terms of error in controlling position for reducing plunger velocity.
Figure 5:
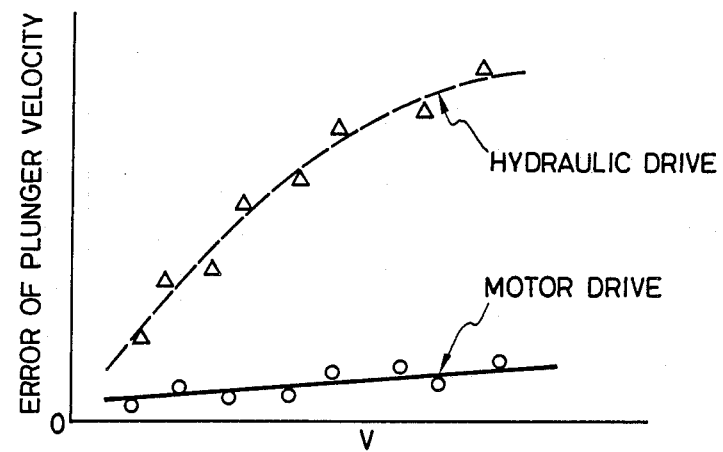
FIG. 5 is a graph comparatively showing the respective plunger control accuracies of the motor drive system and the conventional hydraulic drive system in terms of error in controlling plunger velocity.

FIGS. 4 and 5 comparatively show the respective plunger control accuracies of the motor drive system and the hydraulic drive system respectively in terms of accuracy in controlling position for reducing plunger velocity and error in controlling plunger velocity.

As obvious from FIG. 4, in the conventional hydraulic drive system, error in position for reducing plunger velocity, namely, a position corresponding to the first plunger displacement $d_1$, increases with the increase in the plunger velocity v, whereas, in the motor drive system, the plunger is controlled accurately and error in position for reducing plunger velocity is small regardless of plunger velocity. Therefore, when the movement of the plunger 5 is controlled by the motor drive system, the plunger 5 will never impinge against the resin tablet at a high speed to form voids in the molding even if the plunger velocity is changed to change molding conditions.

The respective molding profiles of the transfer molding apparatus of the motor drive system according to the invention and a transfer molding apparatus of the motor drive system not having a closed loop control function in molding a resin having a low fluidity will be described comparatively hereinafter with reference to FIGS. 2 and 6, in which like reference characters denote like or corresponding values.

Figure 6:
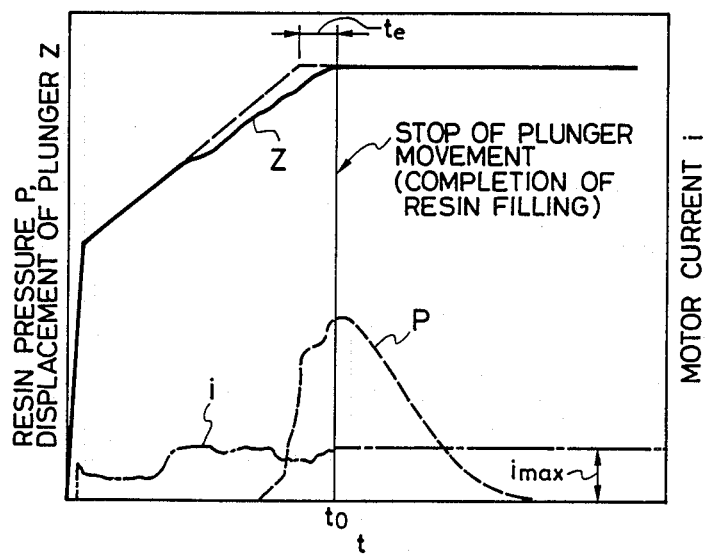
FIG. 6 is a molding profile of a transfer molding process employing a transfer molding apparatus equipped with an electric plunger driving circuit not having a closed loop control function.

Referring to FIG. 6 showing the molding profile of the transfer molding apparatus of a motor drive system not having a closed loop control function, a maximum current $i_{max}$ is supplied continuously to the driving motor after the plunger has been stopped as well as during the downward movement of the plunger. That is, the maximum current is not changed when the displacement of the plunger coincides with the second plunger displacement $d_2$. Accordingly, the current i arrives at the maximum current $i_{max}$ while the resin is being injected and hence the plunger velocity is uncontrollable. Consequently, the gradient of a plunger displacement curve z, namely, the plunger velocity is reduced and thereby the completion of resin injecting operation is delayed by a time $t_e$ from the predetermined time and is completed at time $t_0$. The reduction of the plunger velocity during the resin injecting operation causes the stagnation of the resin in the mold and causes the gelling of the resin due to accelerated hardening reaction caused by increase in heat transfer from the mold to the resin. Consequently, the pressure p of the resin in the cavity of the mold drops in a short time after the completion of the resin injecting operation.

On the contrary, since the transfer molding apparatus of the motor drive system according to the present invention is controlled according to the molding profile shown in FIG. 2, the current i supplied to the motor during the downward movement of the plunger 5 exceeds the secondary maximum current $i_{max2}$, but remains far below the primary maximum current $i_{max1}$, and hence the gradient of plunger displacement z, namely, the plunger velocity, is constant and the completion of the resin injecting operation is not delayed. At time $t_1$, namely, at a moment when the plunger displacement coincides with the second plunger displacement $d_2$, the maximum current is changed from the primary maximum current $i_{max1}$ to the secondary maximum current $i_{max2}$. At time $t_2$ when the plunger 5 is stopped after the resin injecting operation has been completed, the torque control operation is started to apply the pressure p corresponding to the secondary maximum current $i_{max2}$ to the resin, Accordingly, since the resin injecting operation is thus completed without delay, the pressure p prevailing within the cavity of the mold is maintained at a higher level for a longer time than those in the molding profile shown in FIG. 6. Accordingly, the transfer molding apparatus of the present invention produces resin-sealed devices having less defects as compared with those produced by the transfer molding apparatus equipped with the motor drive system not having the closed loop control function.

As apparent from the foregoing description, the transfer molding apparatus of the present invention is capable of easily molding a resin having a low fluidity in a mold having narrow runners, is able to operate under conditions selected from a wide range of molding conditions and is able to control the movement of the plunger at an accuracy higher than that at which the transfer molding apparatus equipped with the conventional hydraulic plunger driving circuit. Thus, the present invention reduces defects in resin-sealed devices and stabilizes the transfer molding operation in the mass production system.

What is claimed is:

1. A transfer molding process for sealing an electronic device in a resin by driving a plunger downward in a pot to inject molten resin into a cavity of a mold, characterized in that a rotary motion of an output shaft of an electric motor is transmitted to the plunger to drive the plunger downward after said rotary motion is converted into a linear motion, that the electric motor is controlled by a control means, the control means having stored therein primary and secondary maximum currents as upper limits of current to be supplied to the electric motor, and that the current supplied to the electric motor is changed from the primary maximum current to the secondary maximum current, at a predetermined displacement of the plunger, before the cavity of the mold is filled completely with the molten resin, the changing from the primary maximum current to the secondary maximum current being controlled by a displacement detecting means detecting displacement of the plunger.

2. A transfer molding process according to claim 1, wherein the plunger is driven downward with a speed, the speed being a relatively high speed initially, then a relatively low speed as compared to said relatively high speed, and then the plunger is stopped upon completion of filling the cavity of the mold with molten resin.

3. A transfer molding process according to claim 2, wherein the relatively high speed and relatively low speed are constant speeds.

4. A transfer molding process according to claim 2, wherein the maximum current is changed from the primary maximum current to the secondary maximum current while the speed of the plunger is maintained at the relatively low speed.

5. A transfer molding process according to claim 4, wherein the control means controls the electric motor such that operation speed of the electric motor is controlled initially, and then such that the torque of the electric motor is controlled, control being changed from the operation speed to the torque of the electric motor when the plunger is stopped, at completion of resin filling of the mold cavity.

6. A transfer molding process according to claim 2, wherein the control means controls the electric motor such that operation speed of the electric motor is controlled initially, and then such that the torque of the electric motor is controlled, control being changed from the operation speed to the torque of the electric motor when the plunger is stopped, at completion of resin filling of the mold cavity.

7. A transfer molding apparatus for sealing an electronic device in a resin by driving a plunger downward in a pot to inject molten resin into a cavity of a mold, comprising:
   driving means consisting of an electric motor for driving the plunger, the electric motor including an output shaft having a rotary motion, and a motion converting mechanism for converting the rotary motion of the output shaft of the electric motor into a linear motion;
   a displacement detecting means for detecting the displacement of the plunger; and
   control means which previously stores a primary maximum current ($i_{max1}$) and a secondary maximum current ($i_{max2}$) smaller than the primary maximum current as upper limits of current to be supplied to the electric motor, and changes the current to said electric motor from the primary maximum current to the secondary maximum current, at a predetermined displacement of the plunger, before the cavity of the mold is filled completely with the molten resin, the changing from the primary maximum current to the secondary maximum current being controlled by the displacement detecting means.

8. A transfer molding apparatus according to claim 7, wherein the primary maximum current ($i_{max1}$), the secondary maximum current ($i_{max2}$) and the predetermined displacement are set beforehand in a microcomputer for controlling the movement of the plunger.

9. A transfer molding apparatus according to claim 7, wherein the displacement of the plunger is detected on the basis of information provided by a pulse generator associated with the electric motor.

10. A transfer molding apparatus according to claim 7, wherein the motion converting mechanism comprises a ball screw jack.

11. A transfer molding apparatus according to claim 1, wherein said output shaft rotates, the output shaft rotating a number of times during the driving of the plunger downward in the pot; and wherein the control means starts controlling the operating speed of the electric motor when a switch for actuating the electric motor to drive the plunger downward is closed, limiting the maximum current to be supplied to the electric motor to the primary maximum current, and limits the maximum current to be supplied to the electric motor to the secondary maximum current after a number of rotations of the output shaft has increased to a predetermined number of rotations, so as to change from the primary maximum current to the secondary maximum current at said predetermined displacement of the plunger.

12. A transfer molding apparatus according to claim 7, further comprising means for controlling speed of the plunger, the speed controlling means controlling the plunger speed at a relatively high speed initially and then at a relatively low speed, and stopping the plunger at completion of resin filling of the mold cavity.

13. A transfer molding apparatus according to claim 12, wherein said relatively high speed and said relatively low speed are constant speeds.

14. A transfer molding apparatus according to claim 12, wherein the speed controlling means and the control means operate such that the maximum current is changed from the primary maximum current to the secondary maximum current while the speed controlling means maintains the speed at said relatively low speed.

15. A transfer molding apparatus according to claim 14, wherein the control means acts initially to control the operation speed of the electric motor, and then acts to control the torque of the electric motor when the plunger is stopped, at completion of resin filling of the mold cavity.

16. A transfer molding apparatus according to claim 12, wherein the control means acts to control the torque of the electric motor when the plunger is stopped, at completion of resin filling of the mold.

17. A transfer molding apparatus according to claim 12, wherein the control means acts initially to control the operation speed of the electric motor, and then to control the torque of the electric motor when the plunger is stopped, at completion of resin filling of the mold cavity.

* * * * *